United States Patent [19]

Anjum et al.

[11] Patent Number: 5,444,024
[45] Date of Patent: Aug. 22, 1995

[54] METHOD FOR LOW ENERGY IMPLANTATION OF ARGON TO CONTROL TITANIUM SILICIDE FORMATION

[75] Inventors: Mohammed Anjum; Ibrahim K. Burki, both of Austin; Craig W. Christian, Buda, all of Tex.

[73] Assignee: Advanced Micro Devices, Inc., Sunnyvale, Calif.

[21] Appl. No.: 258,542

[22] Filed: Jun. 10, 1994

[51] Int. Cl.⁶ .............. H01L 21/265; H01L 21/28
[52] U.S. Cl. .................. 437/200; 437/24; 437/41; 437/933; 148/DIG. 19; 148/DIG. 144
[58] Field of Search ............ 437/200, 24, 40, 41, 437/933; 148/DIG. 19, DIG. 147, DIG. 144; 257/770, 383

[56] References Cited

U.S. PATENT DOCUMENTS

| | | | |
|---|---|---|---|
| 4,551,908 | 11/1985 | Nagasawa et al. | 437/200 |
| 4,558,507 | 12/1985 | Okabayashi et al. | 437/200 |
| 4,683,645 | 8/1987 | Naguib et al. | 437/41 |
| 4,830,971 | 5/1989 | Shibata | 437/29 |
| 5,108,954 | 4/1992 | Sandhu et al. | 437/200 |
| 5,217,924 | 6/1993 | Rodder et al. | 437/200 |
| 5,268,317 | 12/1993 | Schwalke et al. | 437/41 |

FOREIGN PATENT DOCUMENTS

55-151334 11/1980 Japan .................... 437/200

OTHER PUBLICATIONS

Wang, K., et al., "Induced Interface Interactions in Ti/Si Systems by Ion Implantation", J. Vac. Sci. Technol., 16(2), Mar./Apr. 1979, pp. 130–133.
Ku, Y., et al., "Effects of Ion-Beam Mixing . . . With Self-Aligned Silicide Structure", IEEE Electron Device Letters, vol. 9, No. 6, Jun. 1988, pp. 293–295.
Ly, C. Y., et al., "Process Limitation and Device Design Tradeoffs . . . " IEEE Transactions on Electron Devices, vol. 38, No. 2, Feb. 1991, pp. 246–254.
Yoshida, T., et al., "Self-Aligned Titanium Silicided Junctions . . . ", J. Electrochem. Soc., vol. 135, No. 2, Feb. 1988, pp. 481–486.

*Primary Examiner*—T. N. Quach
*Attorney, Agent, or Firm*—Conley, Rose & Tayon

[57] ABSTRACT

A method is provided for controlling growth of silicide to a defined thickness based upon the relative position of peak concentration density depth within a layer of titanium. The titanium layer is deposited over silicon and namely over the silicon junction regions. Thereafter the titanium is implanted with argon ions. The argon ions are implanted at a peak concentration density level corresponding to a depth relative to the upper surface of the titanium. The peak concentration density depth can vary depending upon the dosage and implant energies of the ion implanter. Preferably, the peak concentration density depth is at a midpoint between the upper and lower surfaces of the titanium or at an elevational level beneath the midpoint and above the lower surface of the titanium. Subsequent anneal of the argon-implanted titanium causes the argon atoms to occupy a diffusion area normally taken by silicon consumed and growing within overlying titanium. However, based upon the presence of argon, the diffusion length and therefore the silicide thickness is reduced to a controllable amount necessary for applications with ultra-shallow junction depths.

13 Claims, 3 Drawing Sheets

METHOD FOR LOW ENERGY IMPLANTATION OF ARGON TO CONTROL TITANIUM SILICIDE FORMATION

BACKGROUND OF THE INVENTION

1. Field of the Invention

This invention relates to integrated circuit manufacture and more particularly to multi-layered contact structures using argon implantation to control growth of silicide over an ultra-shallow junction.

2. Description of the Relevant Art

An integrated circuit is by definition a number of electrically interconnected circuit elements defined on the same substrate or "chip" Some of the interconnections are done in the silicon substrate itself, but most are done my means of thin conductive strips running across the top surface of the substrate. Each strip is often connected within a contact area to underlying semiconductor materials (often referred to as "junctions"). Contact to junctions must be of low resistivity and is generally as low as a few micro ohms per square centimeter of contact area.

The conductive strips are usually made of aluminum or aluminum alloy, and, in some instances, can have silicon placed therein. Aluminum adheres well to silicon dioxide and has low contact resistance, but may suffer numerous problems, such as, for example, a propensity to grow "spikes".

In order to reduce contact resistance at the interconnect/silicon juncture, many manufacturers utilize a silicide formed at the juncture. The silicide helps break through the residual surface oxide so that good electrical contact can be made. Applying heat necessary for silicidation is sometimes required to adjust the silicon dioxide—silicon interface states. Silicides are made by depositing a thin layer of metal over the entire wafer, heating the wafer to a high enough temperature for the silicon and metal to react in the contact window areas and then etching away the unreacted metal on top of the oxide. Most metals used to form silicide are transition or refractory metals in group IV(B), V(B) and VI(B).

It important that the silicide be grown to a controlled thickness. If the silicide film becomes too thick, defects can occur at the edge of the silicide film due to stresses in the film. Such defects are reported to begin occurring once the thickness of the silicide film exceed approximately 100 nm. The mechanism for growing silicide is generally understood as species of silicon diffusing from the underlying substrate surface to the overlying (and abutting) titanium. If an excessive amount of silicon atoms are allowed to diffuse, then the silicide is made too thick causing undue stresses in the film. It is therefore important to prevent excessive silicon consumption during the growth process. It is important that the integrity of the underlying junction dopant atoms, once placed, remain in their position to maintain the ultra-shallow junction region and the advantages thereof. Specifically, diffusion of boron atoms from the junction into the growing silicide can deplete the dopant within the silicon surface thereby increasing the sheet resistance at the contact area.

The above problems generally present themselves whenever titanium is used as the base silicide metal, and the underlying junction is p-type, highly mobile boron atoms. While the use of titanium presents many problems, there remains many advantages of titanium. Titanium is a mainstay and essential component in modern contact structures. The juncture between titanium and underlying silicon has low sheet resistivity if a silicide region is formed. Yet, the silicide must not be too thick. An optimal silicide thickness is one that is less than 100nm but is thick enough to maintain uniform thickness in all regions across the upper surface topography.

SUMMARY OF THE INVENTION

The problems outlined above are in large part solved by contact structure and manufacturing process of the present invention. That is, contact structure hereof utilizes argon ions implanted at a peak concentration density depth within the metal titanium such that the argon ions substantially block or prevent a large portion of underlying silicon and/boron atoms from diffusing or migrating into the growing silicide. Thus, argon implant step occurs prior to anneal and is used to minimize consumption of silicon within the growing silicide. Implantation of argon thereby serves as a silicide stop region to prevent silicide growth in the argon-implanted areas. By implanting argon at a controlled depth within the titanium, a thin layer of titanium silicide is allowed to grow from the titanium/silicon interface up to the region containing argon. The ensuing silicide layer is much thinner than conventional titanium silicides, and is dependent upon the specific location in which the argon ions are placed.

The present contact structure is best suited for ultra-shallow junctions (i.e., junctions of less than 1000 Angstroms and, in some instances, less than 600 Angstroms). With ultra-shallow junctions, it is important to minimize the thickness of the silicide in order to prevent the silicide from "spiking" through the junction during its formation. Ultra-shallow junctions cannot incur any substantial spiking and therefore, silicide thickness must be carefully controlled, not only to prevent spiking, but also to minimize silicide film stress at the edges of the film.

Broadly speaking, the present invention contemplates a method for controlling the growth of titanium silicide. The method includes the steps of implanting p-type ions into a silicon substrate to form an ultra-shallow junction region less than 1000 Angstroms in thickness. Next, a layer of titanium is sputter deposited upon the junction region. The layer of titanium includes an upper and lower surface, wherein the titanium upper surface is exposed and the titanium lower surface is adjacent the junction region. Argon ions are then implanted into the layer of titanium to a concentration peak density at a midline between the titanium upper and lower surfaces. The titanium layer can then be heated to react a portion of the titanium lower surface beneath the midline with the junction region to form a titanium silicide layer.

After the titanium silicide layer is formed, the unreacted portion of the titanium layer is removed and a conductor is deposited across the titanium silicide layer. The deposited conductor thereby completes an interconnect contact structure in the contact window area to other contact areas placed elsewhere upon the substrate or chip. The conductor is preferably a metal such as aluminum or a combination of aluminum and silicon.

BRIEF DESCRIPTION OF THE DRAWINGS

Other objects and advantages of the invention will become apparent upon reading the following detailed description and upon reference to the accompanying drawings in which.

Figure 1:
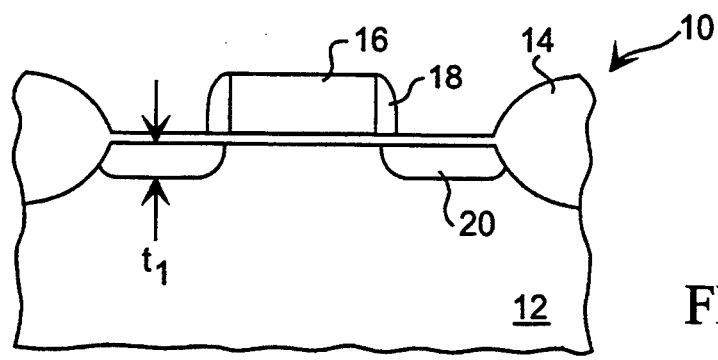
FIG. 1 is a partial cross-sectional view of an integrated circuit formed at an early stage of development according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a partial cross-sectional view of an integrated circuit 10 is shown at an early stage in the development process. Integrated circuit 10 includes a silicon substrate 12 upon which field oxide 14, gate conductor 16 and spacers 18 are formed. Spacers 18 are used in a lightly doped drain (LDD) process. A junction region 20 is implanted in active areas between spacers 18 and field oxide 14. As defined herein ultra-shallow junction refers to a junction region having a thickness less than 1000 Angstroms. Thus, thickness $t_1$ of less than 1000 Angstroms defines an ultra-shallow junction region 20.

Figure 2:
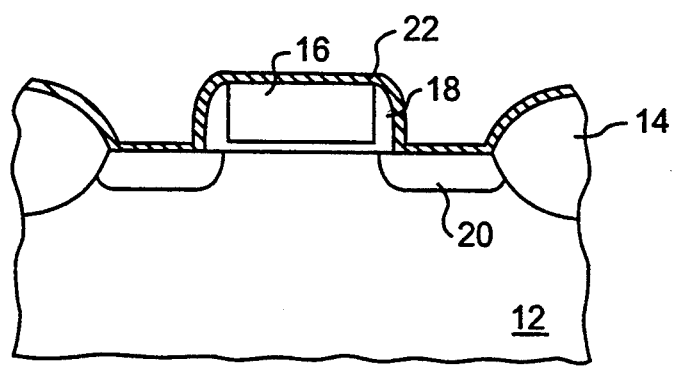
FIG. 2 is a partial cross-sectional view of an integrated circuit formed after deposition of metal according to the present invention.

Referring to FIG. 2, a subsequent processing step is shown in which a metal layer 22 (preferably titanium) is deposited across the entire upper surface. Metal layer 22 can be deposited by sputter deposition from a sputter target of metal or metal alloy. A suitable sputter target comprises titanium. The titanium is sputter deposited onto the upper topography of substrate 12 within a chamber containing an inert species. Preferably titanium is deposited to a thickness in the range of 250 to 600 Angstroms.

Figure 3:
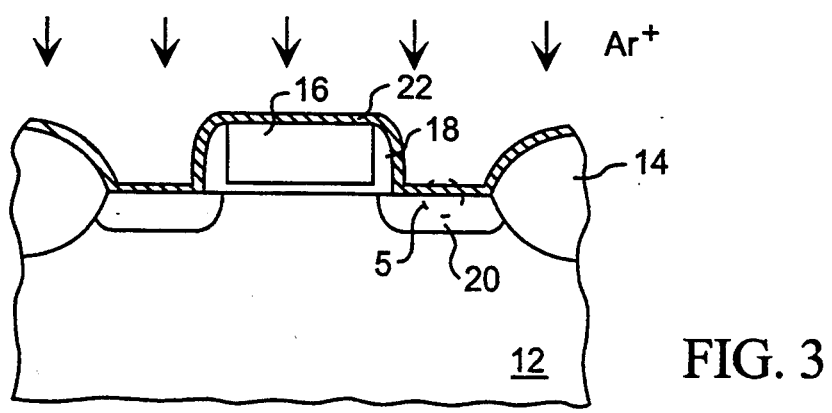
FIG. 3 is a partial cross-sectional view of an integrated circuit formed after argon implant according to the present invention.
Figure 4:
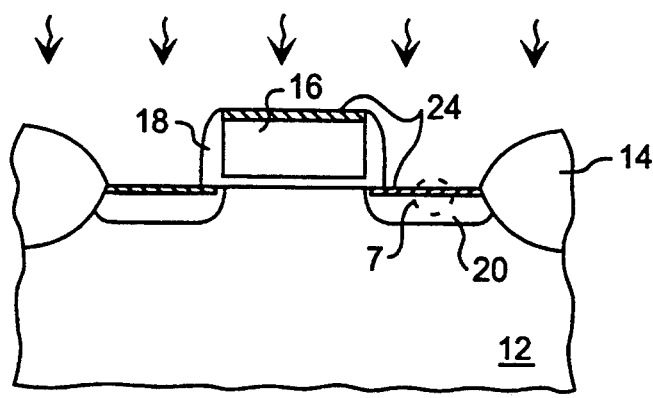
FIG. 4 is a partial cross-sectional view of an integrated circuit formed after anneal (heating cycle) according to the present invention.

After metal layer 22 is deposited, argon ions are implanted into metal layer 22, as shown in FIG. 3. Argon ions are implanted prior to anneal. Anneal step is shown in FIG. 4. Relatively large atomic species argon (atomic weight 40) remain close to their implanted positions at or near the midline region of metal layer 22.

During subsequent anneal, as shown in FIG. 4, a silicide layer 24 is formed during application of anneal temperatures of approximately 800° C. In areas where silicide do not form (or do not react), titanium is removed leaving only the silicide (reacted) areas. The reacted silicide layers 24 exist primarily at the upper surface of junctions 20 and polysilicon gate 16. Pre-implanted argon ions help minimize the consumption of silicon atoms from junction 20 and reduces the growth of ensuing silicide, as further described below. Argon ions are readily present as an inert or noble species which does not react with or chemically alter the thin film (metal) layer into which it is implanted. Thus, argon, being electrically neutral, presents many advantages over nonelectrically neutral species. Moreover, argon is readily available in all ion implant chambers, and is environmentally safe for use in wafer fabrication.

Figure 5:
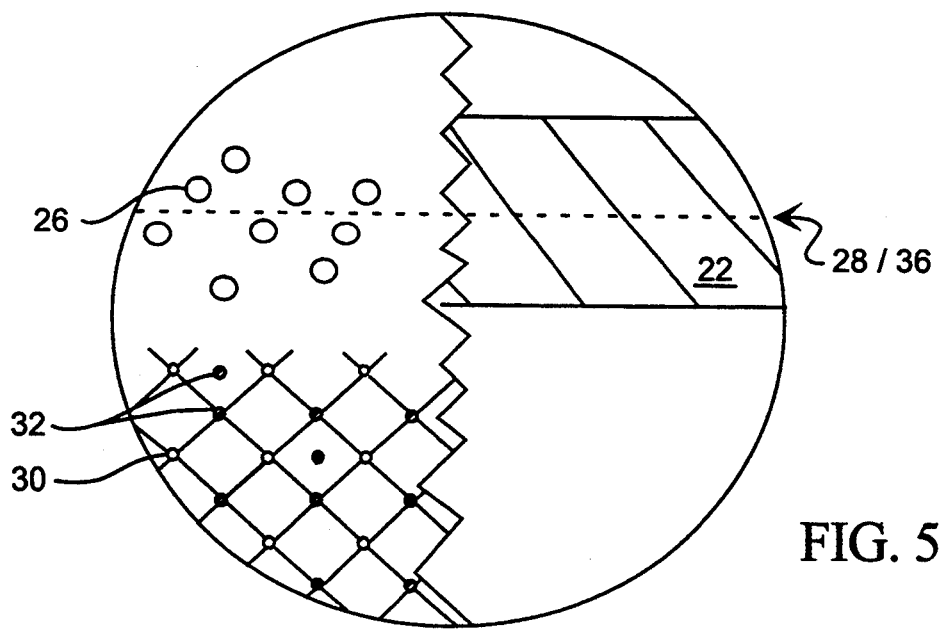
FIG. 5 is a detailed partial breakaway atomic view of area 5 in FIG. 3.
Figure 7:
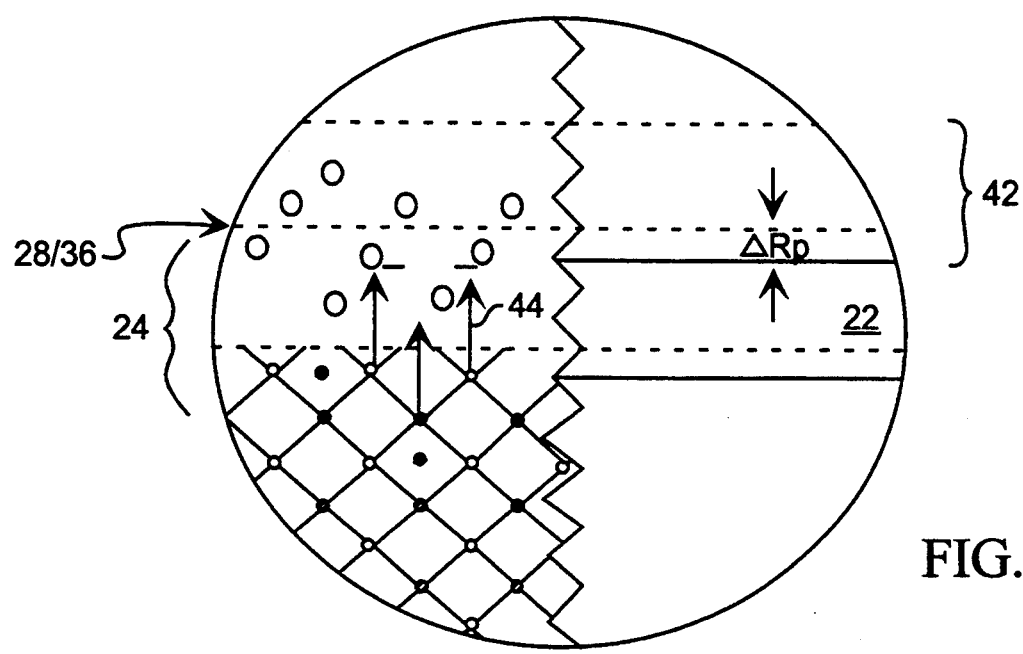
FIG. 7 is a detailed partial breakaway view of area 7 in FIG. 4.

The physical characteristics and possible reasons behind the advantages of argon implantation to reduce silicon and underlying boron consumption are contemplated in reference to detailed atomic view shown in FIGS. 5 and 7. Implantation of argon ions 26 is at a depth, according to one embodiment, at a midline 28 between the upper and lower surfaces of metal (titanium) layer 22. According to another embodiment, peak concentration density of argon ions 26 are implanted at a depth dissimilar from midline 28 and at any depth below midline elevation 28. Accordingly, argon ions 26 are implanted in a manner by which the argon atoms occupy diffusion sites within titanium layer 22. The occupied diffusion sites minimize or substantially reduce the consumption of underlying silicon and boron atoms 30 and 32, respectively. Argon ions 26 are of sufficient atomic weight (or size) for reducing the diffusion length of the underlying silicon and/or boron atoms.

Placement of argon ions 26, wherein the concentration peak density of argon ions 26 are at midline 28 ensures that, during anneal, underlying silicon and boron atoms 30 and 32, respectively, do not substantially diffuse past midline 28. As described below, the resulting silicide is formed as a thin layer existing below midline 28. To achieve, for example, argon ions 26 at midline 28 of a 300 Angstrom titanium layer, the argon ions 27 are implanted at a sufficient concentration to minimize underlying silicon and boron diffusion. Argon ions 26 are implanted into a 300 Angstrom titanium layer using a medium to high current implantation device using, for example, a dose within the range of $5 \times 10^{15} - 1 \times 10^{16}$ atoms/cm² and at an implant energy of approximately 17 keV. At such dosage and energy levels, and assuming titanium layer 22 thickness of approximately 300 Angstroms, an exemplary peak concentration density depth (relative to the upper surface of titanium 22) is approximately 150 Angstroms, with a $\Delta R_p$ (straggle) of approximately 83 Angstroms.

Figure 6:
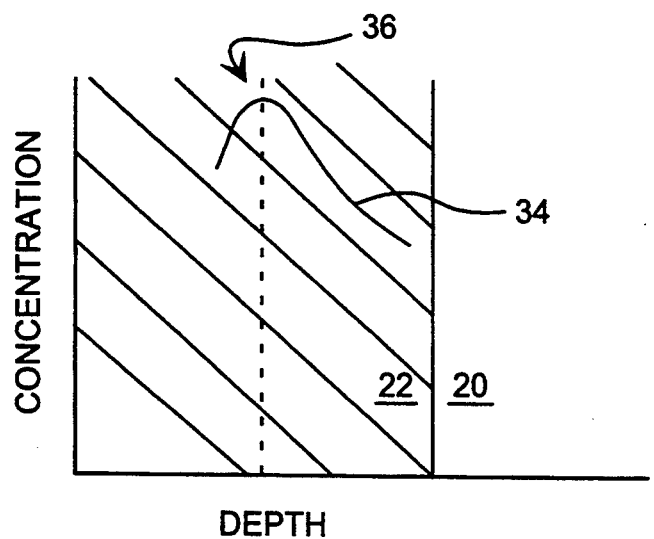
FIG. 6 is a graph of depth versus concentration of argon atoms within titanium and silicon before anneal according to the present invention.

Argon ions are implanted at a depth sufficient for them to act as barriers for silicon and boron consumption at the anneal stage. A certain percentage of implanted argon ions 26 exist below the lower surface of titanium layer 22 and within junction region 20. It is postulated that argon ions exist as atomic barriers at diffusion path (i.e., silicidation path) sites normally taken by underlying silicon atoms 30. Occupancy of diffusion sites help minimize or reduce diffusion or interstitial movement of highly mobile silicon atoms 30 from junction 20 into titanium 22. Referring to FIG. 6, implant profile curve 34 is shown of argon ions implanted into titanium layer 22 and into the upper surface of junction region 20. A peak concentration density 36 exists at a depth above the lower edge of titanium layer 22. According to one embodiment, the peak concentration density 36 exists at a midline between the upper and lower edges of titanium layer 22. According to another embodiment, peak concentration density 36 exists between the midline and a lower edge of titanium layer 22. It is appreciated from the alternative embodiments that peak concentration density depth 36 can be adjusted according to user-defined specifications, and that a peak concentration density at the midline region will allow more silicide to grow into the lower regions of titanium 22 that if the peak concentration density were below the midline region. It follows that higher elevational positions of the peak concentration density allows more silicide to grow. With ultra-shallow junctions, it is a preferred outcome that the silicide be as shallow as possible yet thick enough to provide low ohmic contact (less than a few micro ohms per square centimeter) between the overlying metal and the underlying silicon.

Referring now to FIG. 7, a detailed partial breakaway atomic view of area 7 in FIG. 4 is shown. In particular, the lower portion of titanium layer 22 reacts in the presence of an anneal temperature to form a reacted region 24. Reacted region 24 comprises titanium silicide ($TiSi_2$). The unreacted portion 42 of titanium layer 22 can be removed in an subsequent etch process. The etch process removes only the unreacted titanium 42 and does not react with or remove the reacted silicide region 24 formed therebelow.

Use of argon ions 26 ensures the diffusion length of silicon, shown as reference numeral 44, is shortened. Diffusion length 44 is shortened by an amount approximately equal to the closeness of the concentration peak density depth 36 to the lower surface of titanium layer 22. Thus, the closer depth 36 is to the lower surface of titanium layer 22, the shorter is diffusion length 44. By controlling implant dosage and energy, concentration peak density 36 can be maintained at a depth which can purposefully control diffusion length 44, and thereby, the thickness of titanium silicide 38. It is contemplated that silicon atoms can migrate into titanium 22 approximately equal to a straggle depth $\Delta R_p$ lower than (or less than) the peak concentration density depth. Accordingly, the presence of argon ions suppress underlying silicon diffusivity into the titanium yet maintains a thin layer of silicide at a uniform thickness across the titanium/silicon interface, regardless of topological features or step disparities.

Figure 8:
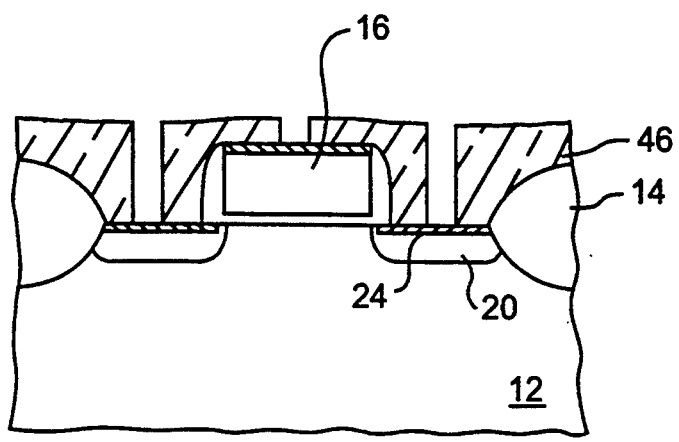
FIG. 8 is a partial cross-sectional view of an integrated circuit formed after overlying interconnect deposition according to the present invention.

To complete interconnect contact in the contact structure hereof, a contact window is formed through a dielectric layer 46, as shown in FIG. 8. Layer 46 electrically isolates the underlying topography from an overlying metal conductor (not shown). The metal conductor extends through the contact window and therefore through layer 46 to the underlying silicide 24. Silicide 24 is annealed in the step shown in FIG. 4 in the presence of, for example, a nitrogen ambient to form a TiN barrier near the upper surface of silicide 24. Thus, the contact structure hereof comprises the following layers arranged from the uppermost to the lowermost regions: Al—TiN—Ti/Ar—$TiSi_2$—Si.

It will be appreciated to those skilled in the art having the benefit of this disclosure that this invention is believed to be capable of applications with any integrated circuit requiring low resistivity contact structures and that multiple levels of interconnect can be formed with dielectric structures between each level. Furthermore, it is also to be understood that the form of the invention shown and described is to be taken as exemplary presently preferred embodiments. Various modifications and changes may be made to each and every processing step as would be obvious to a person skilled in the art without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A method for controlling the growth of titanium silicide, comprising the steps of:
   implanting p-type ions into a silicon substrate to form an ultra shallow junction region less than 1000 Angstroms in thickness;
   sputter depositing a layer of titanium upon said junction region, said layer of titanium having an upper and lower surface wherein the titanium upper surface is exposed and the titanium lower surface is adjacent said junction region;
   implanting argon ions into said layer of titanium to a concentration peak density at a midline between the titanium upper and lower surfaces; and
   heating in the presence of nitrogen to react a portion of the titanium lower surface beneath the midline with the junction region to form a titanium silicide layer.

2. The method as recited in claim 1, further comprising the steps of:
   removing the unreacted portion of said titanium layer; and
   sputter depositing a conductor across said titanium silicide layer to complete an interconnect contact structure.

3. The method as recited in claim 1, wherein said implanting step comprises inserting pre-existing argon ions contained within an implant chamber into said layer of titanium at a dose of $5 \times 10^{15} - 1 \times 10^{16}$ atoms/$cm^2$ and at an energy of approximately 17 keV, wherein the concentration peak density is at a depth of 150 Angstroms relative to the titanium upper surface.

4. The method as recited in claim 1, wherein said implanting step comprises inserting argon ions into said layer of titanium at a range straggle, $\Delta R_p$, of less than 100 Angstroms.

5. The method as recited in claim 1, wherein said heating step comprises inserting said silicon substrate into a chamber, filling said chamber with a nitrogen gas, and heating said substrate.

6. The method as recited in claim 1, wherein said heating step comprises inserting said silicon substrate into a preheated chamber and filling said chamber with a nitrogen gas.

7. The method as recited in claim 1, wherein said p-type ions comprise boron ions.

8. A method for growing a titanium silicide to an uppermost elevational height corresponding to a concentration peak density depth set forth during an argon implantation step, the method comprising the steps of:
   implanting boron ions into an upper surface of a silicon substrate to form a junction region of less than 1000 Angstroms in thickness measured from the upper surface of the silicon substrate;
   sputter depositing a layer of titanium upon said junction region, said layer of titanium having an upper and lower surface wherein the titanium upper surface is exposed and the titanium lower surface is adjacent said junction region;
   implanting argon ions across said layer of titanium to a concentration peak density depth as measured from the titanium upper surface at an elevational level below a midline elevation between the titanium upper and lower surfaces; and reacting a portion of the titanium lower surface beneath said midline with the junction region to form a reacted layer of titanium silicide having an upper surface substantially equal to the elevational height corresponding to the concentration peak density depth of the implanted argon ions.

9. The method as recited in claim 8, further comprising the steps of sputter depositing a conductor across said titanium silicide to complete an interconnect contact structure.

10. The method as recited in claim 8, wherein said implanting steps comprises inserting pre-existing argon ions contained within an implant chamber into said layer of titanium at a dose of $1 \times 10^{15} - 1 \times 10^{16}$ atoms/cm$^2$ and at an energy of approximately 17 keV, wherein the concentration peak density is at a depth of 150 Angstroms relative to the titanium upper surface.

11. The method as recited in claim 8, wherein said implanting step comprises inserting argon ions into said layer of titanium at a range straggle, $\Delta R_p$, of less than 100 Angstroms.

12. The method as recited in claim 8, wherein said growing step comprises inserting said silicon substrate into a chamber, filling said chamber with a nitrogen gas, and heating said substrate.

13. The method as recited in claim 8, wherein said growing step comprises inserting said silicon substrate into a preheated chamber and filling said chamber with a nitrogen gas.

* * * * *